United States Patent
Wu

[11] Patent Number: 5,869,374
[45] Date of Patent: Feb. 9, 1999

[54] METHOD TO FORM MOSFET WITH AN INVERSE T-SHAPED AIR-GAP GATE STRUCTURE

[75] Inventor: Shye-Lin Wu, Hsinchu, Taiwan

[73] Assignee: Texas Instruments-Acer Incorporated, Hsinchu, Taiwan

[21] Appl. No.: 64,262

[22] Filed: Apr. 22, 1998

[51] Int. Cl.$^6$ .................................................. H01L 21/336
[52] U.S. Cl. .......................... 438/291; 438/305; 438/592
[58] Field of Search .................................... 438/291, 305, 438/307, 303, 592, 289

[56] References Cited

U.S. PATENT DOCUMENTS

| | | |
|---|---|---|
| 4,963,504 | 10/1990 | Huang . |
| 5,583,067 | 12/1996 | Sanchez . |
| 5,585,295 | 12/1996 | Wu . |
| 5,595,919 | 1/1997 | Pan . |
| 5,599,725 | 2/1997 | Dorleans et al. . |
| 5,736,446 | 4/1998 | Wu . |

OTHER PUBLICATIONS

M. Togo et al., *A Gate–Side Air–Gap Structure (GAS) to Reduce the Parasitic Capacitance in MOSFETs*, 1996 Symposium on VLSI Technology Digest of Technical Papers, pp. 38–39.

Tiao–Yuan Huang et al., *A New LDD Transistor with Inverse-T Gate Structure*, IEEE Electron Device Letters, vol. EDL–8, No. 4, Apr. 1987, pp. 151–153.

D. Hagmann et al., *A Method to Impede the Formation of Crystal Defects after High Dose Arsenic Implants*, J. Electrochem. Soc.: Solid–State Science and Technology, Dec. 1986, pp. 2597–2600.

*Primary Examiner*—Richard A. Booth
*Attorney, Agent, or Firm*—Harness, Dickey & Pierce, P.L.C.

[57] ABSTRACT

A method for fabricating a MOS transistor with an inverse T-shaped air-gap gate structure on a semiconductor substrate is disclosed. The T-shaped air-gap gate structure reduces the parasitic resistance and capacitance; hence device structure operation speed can be improved. The method comprises the following steps: firstly, a gate hollow is defined in the pad oxide/nitride layer. Next an ultra-thin nitrogen rich dielectric as a gate oxide is formed. After that, a thin α-Si is deposited, then an ion implantation is done to form a punchthrough stopping region. After forming a CVD oxide film, an anisotropic etching is followed to form oxide spacers. An undoped silicon layer then followed to refill the gate hollow region. A CMP processes or a dry etching is done to remove silicon layer until the nitride layer is exposed. Subsequently, the oxide spacers is removed to expose a dual hollow. A LDD implantation is then implanted into the substrate. Next a pad nitride/oxide layer is successive removed to expose the substrate by a dry etching method. Subsequently, a source/drain/gate implantation and a hight temperature oxidation are carried out to grow an oxide layer and seal the dual hollow so as to form a dual air gap. At the same time the extended S/D junction are formed.

16 Claims, 5 Drawing Sheets

METHOD TO FORM MOSFET WITH AN INVERSE T-SHAPED AIR-GAP GATE STRUCTURE

FIELD OF THE INVENTION

The present invention relates to a semiconductor device process, and more specifically, to a method to form a MOSFET with an inverse T-shaped air-gap gate structure.

BACKGROUND OF THE INVENTION

Recently, the rapid progression of the microelectronic technology demands the devices with high speed which operate at low voltages to lessen the power consumption, as well as reduce the cost per unit chip. Hence, the method to approach such purpose is generally by scaling the device dimension down. For example, for CMOS device, by scaling to 0.1 μm which operates at 1 V range is known to have the speed enhancement of about 3× as compared with the performance of a 0.35 μm device at 3.3 V. However, in short-channel MOSFETs, the stringent issues may suffer, such as hot carrier effects, punchthrough effects, parasitic resistance etc., and are required to be overcome.

A double-diffused drain (DDD) or a lightly doped drain (LDD) technology has been proposed to alleviated hot carrier effects. The DDD structure allows little freedom in reducing maximum lateral electric field $E_{max}$ in the channel since the n- length cannot be easily controlled. On the other hand, LDD structures especially low-dose LDD, circumvent disadvantages and are beneficial in reducing $E_{max}$; nevertheless, the low-dose LDD structure is known to have faster spacer-induced degradation rates than transistors with higher substrate current $I^{sub}$. As is reported in the reference, "T. Y. Huang, et al., "A New LDD Transistor with Inverse-T gate Structure", IEEE Electron Device Lett., EDL-8, p. 151 (1987)", Huang proposed a new submicrometer LDD transistor which eliminates the forgoing spacer-induced degradation. However, Huang also pointed out that the device with an inverse-T gate structure has about 2.5 times the overlap ($C_{ov}$)(i.e. the capacitance between source/drain and the gate) than that of conventional LDD. The reason is due to its device structure with an entire LDD region under the gate. In addition, another parasitic capacitance—the gate fringe capacitor ($C_{FR}$), around the gate electrode of a MOSFET and the junction capacitance ($C_J$) are difficult to reduce too. The lager values of the parasitic capacitance give longer RC delay time.

Hence, minimizing parasitic capacitance is a key issue for realizing high speed and low-power ULSI. The $C_{ov}$ and $C_J$ can be reduced by adjusting the sidewall thickness, and by self-aligned counter well doping, or by implanting a channel impurity locally around the gate electrode, as is stated in the paper, "M. Togo, et al., "A Gate-side Air-gap Structure (GAS) to Reduce the Parasitic Capacitance in MOSFETs", Symp. On VLSI Tech. Dig., p. 38 (1996)." Besides, Togo et al. also proposed that the transistor with gate-side air-gap structure (GAS) could be used to minimize the $C_{FR}$. The GAS in which a 5-nm-wide air gap formed next to the gate is found to reduce the fringe capacitance by half. Hence the gate delay time is reduced by 4.8 psec at fan out =1 and 16 psec at fan out =3 in a 0.25 μm CMOS, and the power consumption is lowered compared to a conventional structure. In addition, the GAS structure does not be found to degrade electrical characteristics or reliability, as is depicted in the paper.

The fabrication of GAS structure as proposed by Togo is shown in FIGS. 1 (a)-(d), and will restate as following: After gate etching, a 20 nm wide $Si_3N_4$ sidewall is fabricated (FIG. 1 (a)). Next a 50 nm thickness $SiO_2$ layer 50 is formed, and is etched back (FIG. 1 (b)), after that, the $Si_3N_4$ sidewall 20 is removed by wet etching to form the air gap 25 (FIG. 1(c)), and 50 nm thick $SiO_2$ layer 60 is deposited to form the air-gap cap and is etched back (FIG. 1 (d)).

SUMMARY OF THE INVENTION

The disadvantages of forgoing prior art are that the device includes either a GAS structure or inverse T shape gate structure but not both; the issues of the maximum lateral electrical field and the parasitic resistance and the capacitance can not be resolved at one time. Thus, in the present invention, a method for fabricating a MOS transistor with an inverse T-shaped air-gap gate structure on a semiconductor substrate is proposed.

The method comprises following steps: At first, a nitride layer is deposited to about 80–300 nm on a pad oxide and on field oxide regions of the silicon substrate. After that, patterning the nitride layer by using a photoresist as a mask is done to define the gate region. Then a dry etching is performed to form a gate hollow till the silicon substrate is exposed. Subsequently, a thin nitrogen rich dielectric layer is formed on the bottom of the gate hollow by a thermally grown method to about 20–200 nm in thickness at 700°–1100° C. in $N_2$ ambient with dilute $O_2$, the ratio for $O_2$:$N_2$ is approximately to about 1:99 or 2:98. The thin dielectric layer can be grown in $N_2O$ or NO ambient too. A thin α-Si is then deposited of about 10–50 nm on all areas by a PECVD method. Then a punchthrough stopping implant is done to form a p- region for NMOS or a n-region for PMOS in the substrate, wherein the region is under the bottom of the gate hollow. After that, a CVD oxide layer is deposited and refilled the hollow and then an anisotropic etching is achieved to form oxide spacers on the sidewalls of the gate hollow. An undoped poly-Si (or α-Si) layer is then followed to deposit and refill the gate hollow region. A chemical/mechanical polishing processes or a dry etching is done to form a flat surface by removing the polysilicon and/or α-Si until the nitride layer is exposed.

After removing the oxide spacers, a dual hollow spaced by poly-Si layer is formed in the hollow gate. A LDD implantation is then implanted into the substrate to form n- (for NMOS) or p- region (for PMOS) where the region is beneath the thin nitrogen rich dielectric layer. A pad nitride/oxide layer is successively removed to expose the substrate by a dry etching method. Subsequently, a source/drain/gate implantation is carried out, then a high temperature oxidation process at about _700°–1100° C. for 0.5–120 min is implemented to grow an oxide layer on the gate structure region. Since the doping impurity can assist the oxidation, hence the rapid growth of the oxide layer in the doped region, especially,the region at the top of the gate dilates and seals the dual hollows to form dual air gaps. At the same time an oxide layer is formed on the periphery of the gate structure and substrate.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

A method for fabricating a MOS transistor with an inverse T-shaped air-gap gate structure on a semiconductor substrate is disclosed. The detailed processes will be described as follows.

Figure 1:
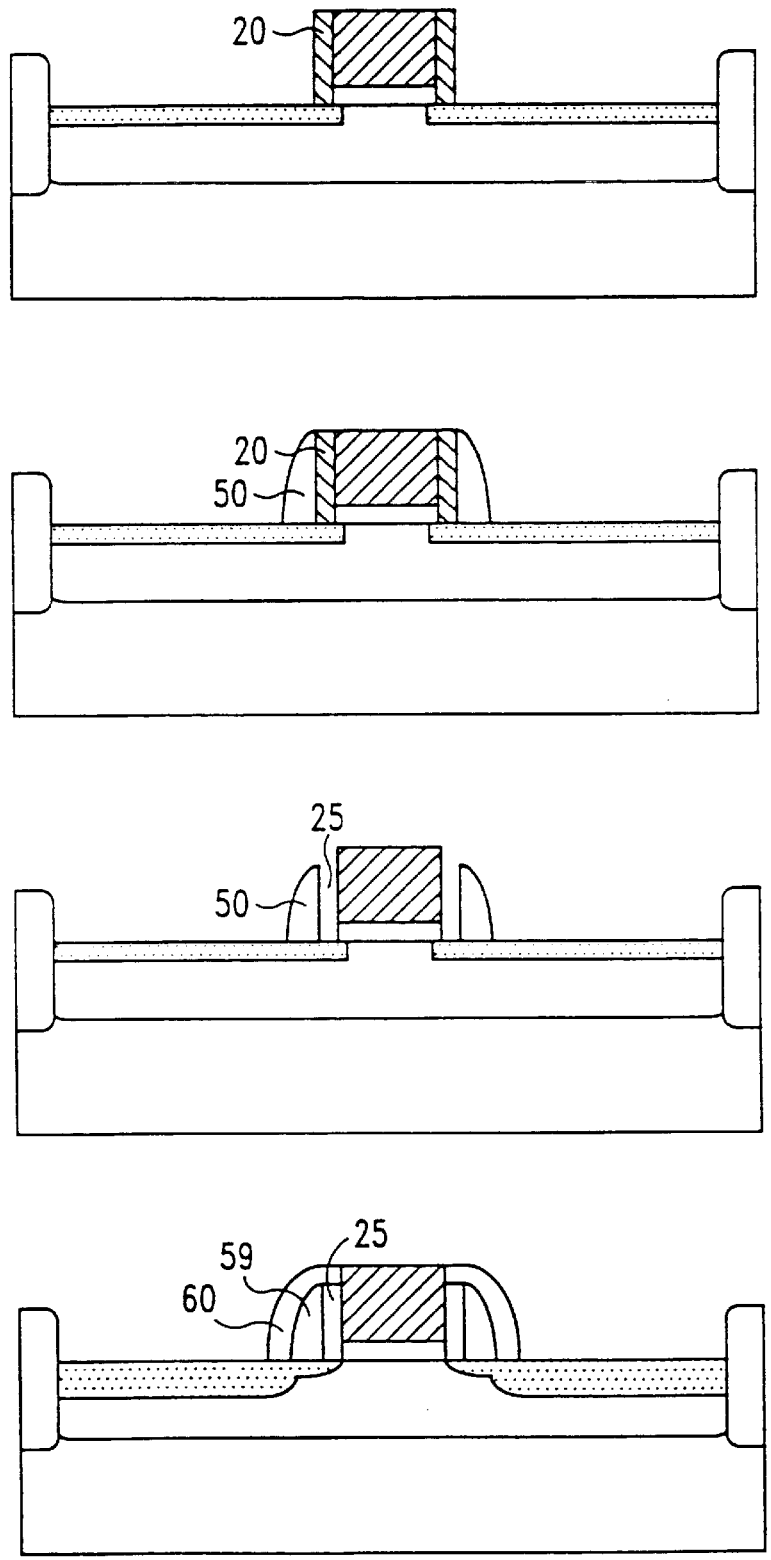
FIG. 1 is a cross-sectional view of a MOSFET with a GAS structure in accordance with prior art.
Figure 2:
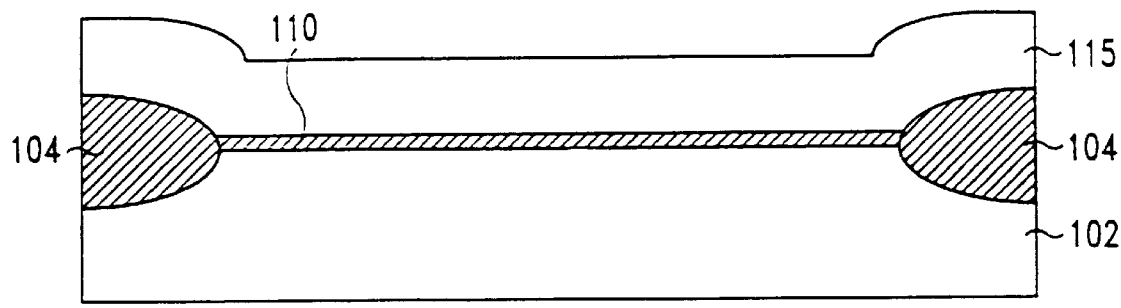
FIG. 2. is a cross-sectional view of a deposition of a pad oxide/nitride on a silicon substrate in accordance with the present invention.
Figure 3:
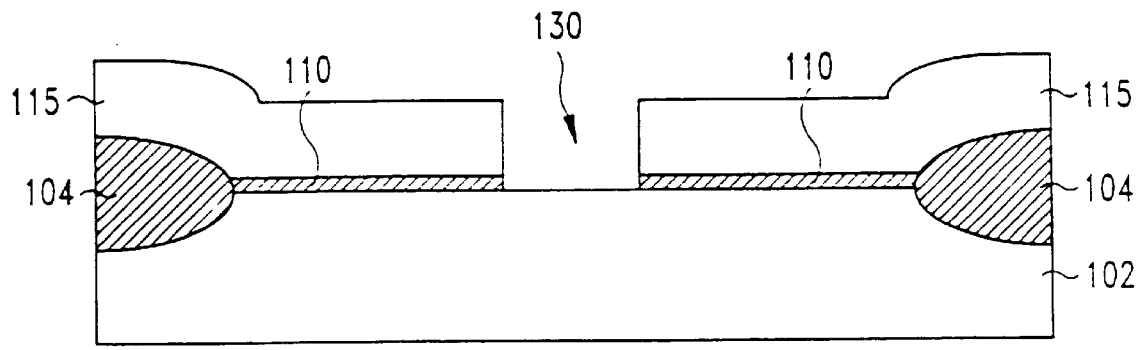
FIG. 3. is a cross-sectional view of a gate hollow region formed on the substrate in accordance with the present invention.

FIG. 2 shows a results of a cross-sectional view for a thick nitride 115 layer as a hard mask is deposited by a CVD method formed atop a thin pad oxide layer 110 and a plurality of field oxide 104 on a <001> orientation silicon substrate 102. The field oxide regions is formed by a known LOCOS (local oxidation of silicon process). In a preferred embodiment, the thick nitride 115 is deposited by a method such as low-pressure CVD (LPCVD) at about 700°–800° C. to a thickness of about 80–300 nm Referring to FIG. 3, a photoresist (not shown) is used to pattern a gate region 130 via the lithography technology. A selective etching method, such as plasma etching or reactive ion etching (RIE) is performed until the substrate is exposed so that a gate hollow 130 is formed in the pad oxide/nitride layer. Preferably, the dry etching is stopped at the pad oxide by using the thin pad oxide 110 as an etching stopping layer, and then using a wet etching to etch the remnant pad oxide so that the damages occurred during the etching process can be minimized.

Figure 4:
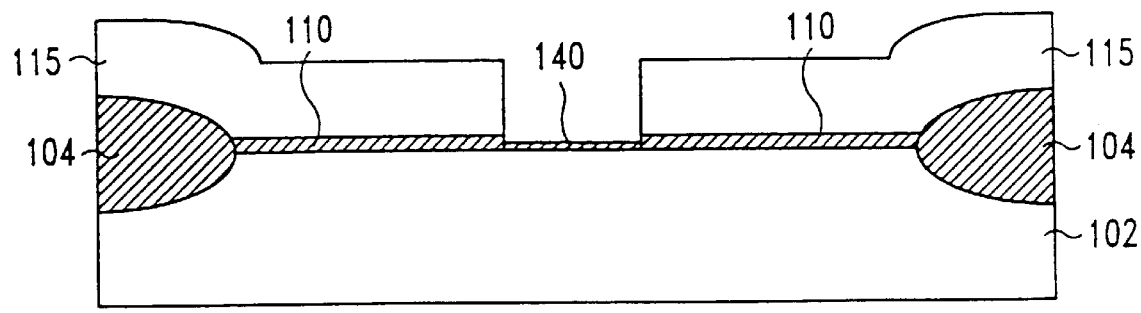
FIG. 4. is a cross-sectional view of a thin nitrogen rich gate oxide layer thermally grown on the bottom of the gate hollow region in accordance with the present invention.

Subsequently as shown in FIG. 4, for the purpose to increase the dielectric constant of the gate oxide, a ultra thin nitrogen rich gate oxide 140 is regrown on the gate hollow region 130 of the substrate 102 in a $N_2$ ambient but with diluted $O_2$, $N_2O$ or NO.

Preferably, the ratio for $O_2$: $N_2$ is about 1:99 or 2:98, and the regrown temperature is about 700°–1100° C. to about 2–20 nm in thickness.

Figure 5:
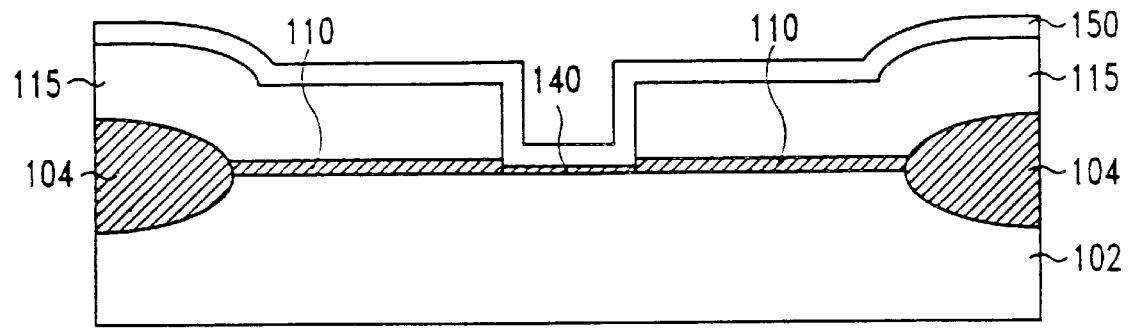
FIG. 5. is a cross-sectional view of a thin α-Si layer formed on all areas in accordance with the present invention.

Then as shown in FIG. 5, an undoped thin amorphous silicon layer 150 (hereafter called α-Si layer) of about 10–50 nm is deposited over all exposed areas. Since for forming a α-Si layer, lower temperature is necessary, and hence a low temperature process, PECVD method is preferred. Another process, such as LPCVD can also be used, and the temperatures are about 350° to 560° C.

Figure 6:
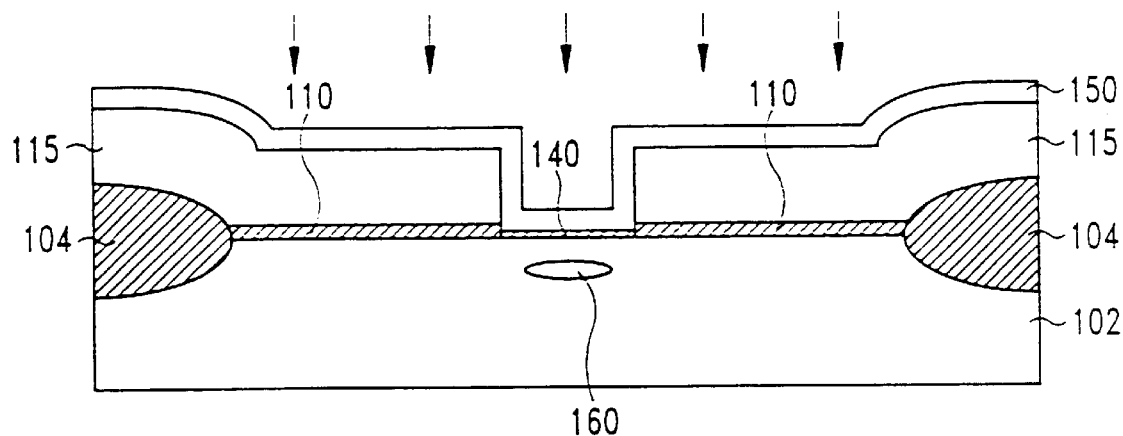
FIG. 6. is a cross-sectional view of performing an implant on all areas to form a punchthrough stopping region in the substrate where the substrate is under the bottom of the gate hollow region in accordance with the present invention.

Referring to FIG. 6, a species of p-type (for NMOS, or n-type ions for PMOS) ion implantation (indicated by arrows) through α-Si 150 is followed to form punchthrough stopping regions 160 in the interior of the substrate 102, where the substrate is beneath the thin nitrogen-rich dielectric layer 140. Preferably, the species of p-type ions is selected from $BF_2^+$ or boron ions (arsenic, or phosphorus for n-type ions), and with an energy and a dosage of about 30–150 keV and of about $5 \times 10^{11}$–$5 \times 10^{13}$/cm$^2$, respectively.

Figure 7:
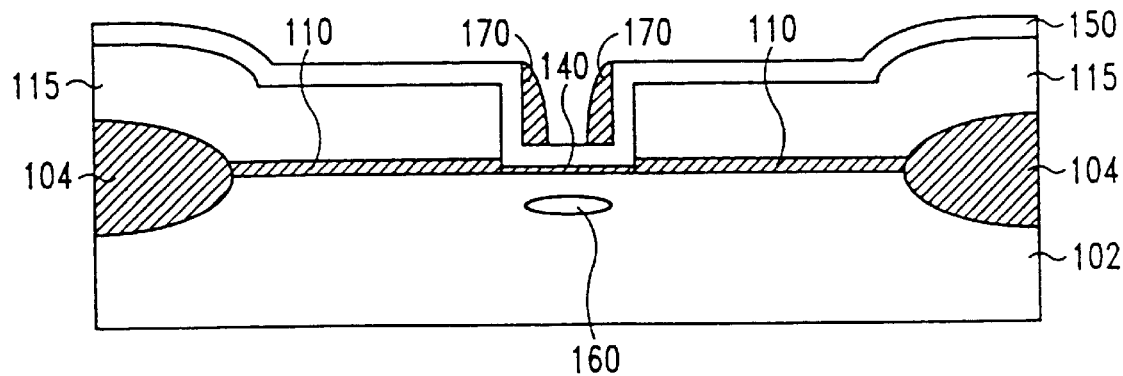
FIG. 7. is a cross-sectional view of an anisotropic etching the oxide layer to form oxide spacers on the sidewalls of gate hollow region in accordance with the present invention.

Subsequently, a thin CVD oxide layer of about 20–50 nm in thickness is deposited on all areas and then anisotropic etching is used to form oxide spacers 170 on the sidewalls of the gate region 130, as shown in FIG. 7. A method selected from PECVD or LPCVD method or, especially a LPCVD TEOS (tetraethyl orthosilicate, $Si(OC_2H_5)_4$, or a ECRCVD (electron cyclotron resonance CVD) can be used to deposit the oxide layer. It is noted that there is about 5% volume difference between amorphous silicon and crystalline silicon. Hence it will affect the final width-size of GAS after the processes are finished. On the other hand, higher deposition temperature (e.g. over 560° C.) will induce the regrowth to occur (from α-Si to poly-Si). So, the deposition temperature is critical. A LPCVD TEOS is often used to form spaces for its very good uniformity, but it has to be operated at temperatures of about 700° to 750° C. hence, all α-Silicon regrow to poly-Si is expected. On the other hand, a ECRCVD technique has been shown to fill high-aspect-ratio gaps without voids and seams is also preferred. However, if a PECVD process is selected to deposit the oxide layer, then α-Si 150 will not be transformed, since the deposition temperatures are rather low (e.g.300°–550° C.).

Figure 8:
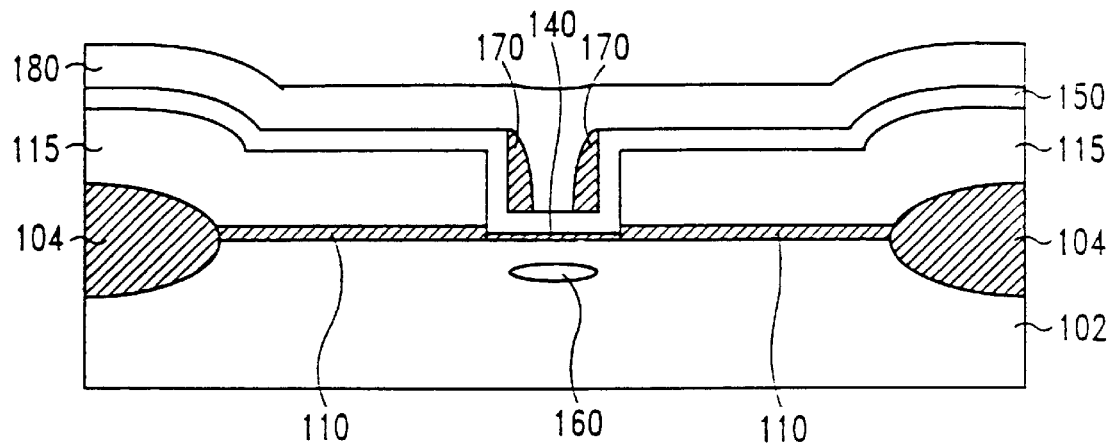
FIG. 8. is a cross-sectional view of a poly-Si (or α-Si) deposition to refill the gate hollow region in accordance with the present invention.

FIG. 8 shows an undoped poly-Si (or α-silicon layer) 180 is deposited on all areas and refilled the gate hollow 130. The method for forming α-Si can be a LPCVD or PECVD (operate at temperature about 400°–550° or 250°–400° C., respectively), but to form poly Si a higher temperature LPCVD process is required. To form poly-Si or α-Si relies on the width of gate hollow 130 (for an example, to refill the hollow for 0.1 μm width, α-Si is prefer, but for 0.25 μm or above, the material can be poly-Si or α-Si ).

Figure 9:
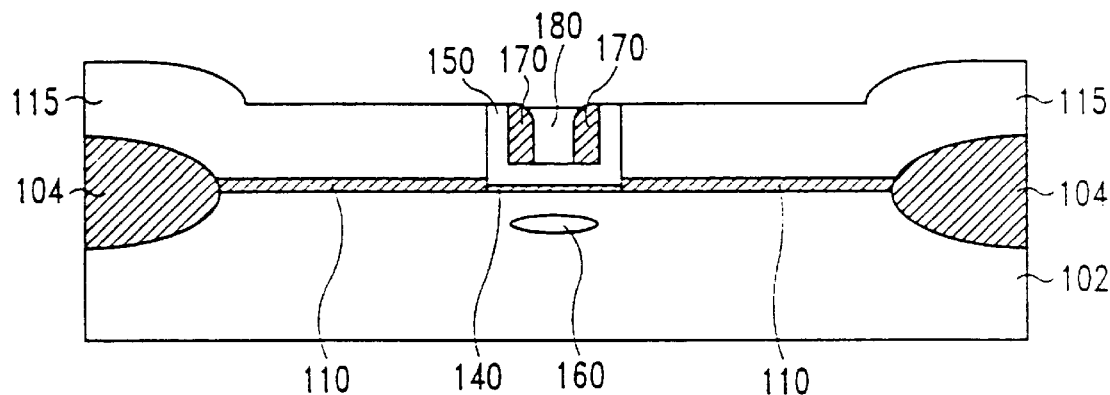
FIG. 9. is a cross-sectional view of etching back undoped silicon layer until a nitride is deposited in accordance with the present invention.

Referring to FIG. 9, a dry etching method or chemical/mechanical polish (CMP) process by using nitride layer 115 as an etching stopping layer or as a CMP stopping layer is achieved to form a flat surface.

Figure 10:
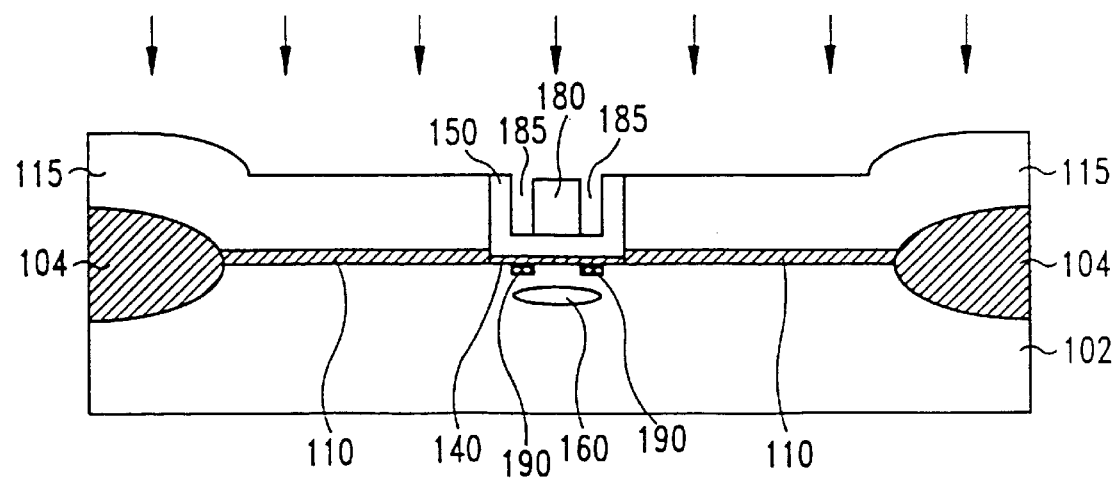
FIG. 10. is a cross-sectional view of to form dual LDD region in the interior of the substrate where the substrate is under the bottom of dual hollow region in accordance with the present invention.

After that, an additional etching step is performed to remove the oxide spacers 170 and, then a dual hollow 85 spaced by the poly-Si (or α-Si) 180 in the gate hollow region are formed. Subsequently, a lightly drain doping (LDD) implant by n-type ions through the α-Si 150 into the substrate 102 is achieved to form n- region 190 (P- LDD for PMOS transistor), where the substrate 102 is beneath the bottom of two hollows 185. The result is shown in FIG. 10. The n-type ions can be selected from a group consists of arsenic, phosphorus or antimony. An energy and a dosage are about 10–80 keV and about $5 \times 10^{13}$–$2 \times 10^{14}$/cm$^2$ respectively.

Figure 11:
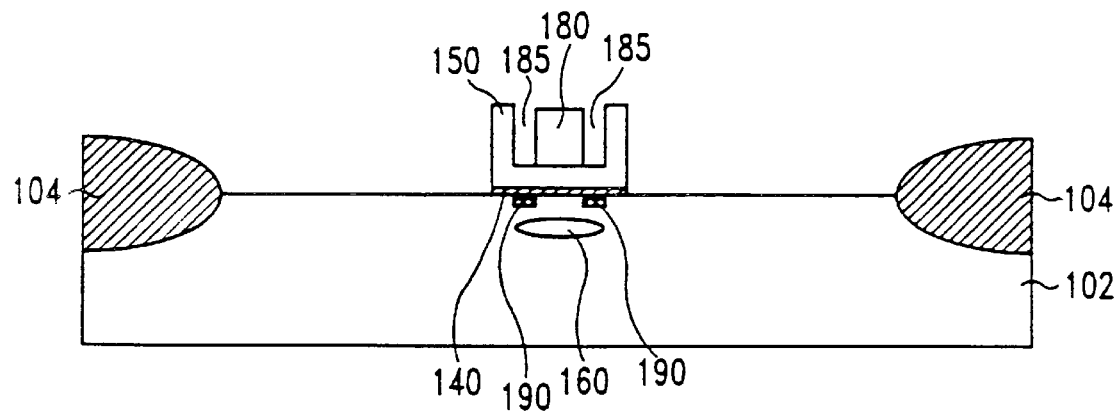
FIG. 11. is a cross-sectional view of removing the pad nitride/oxide layer to expose the silicon substrate in accordance with the present invention.

Referring to FIG. 11, the pad oxide/nitride layers be removed successively to expose the substrate 102 by a method such as plasma etching or RIE.

Figure 12:
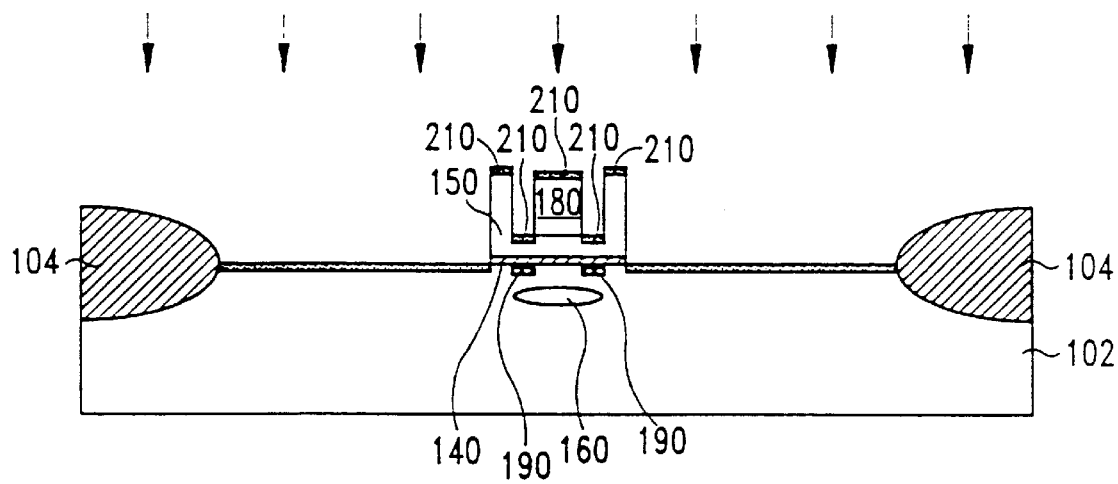
FIG. 12. is a cross-sectional view of an ion implantation to form source/drain/doped gate region in accordance with the present invention.

As shown in FIG. 12, a low energy, heavy dose, source/drain/gate (S/D/G) implant by a species of n-type, e.g. As$^+$ or P$^+$(for PMOS, a species of p-type ions are selected) is carried out to form S/D region 200 and doped gate regions 210. For the S/D/G implantation, the energy and the dosage are about 0.5–60 keV and about $10^{14}$–$2\times10^{16}$/cm$^2$, respectively.

Figure 13:
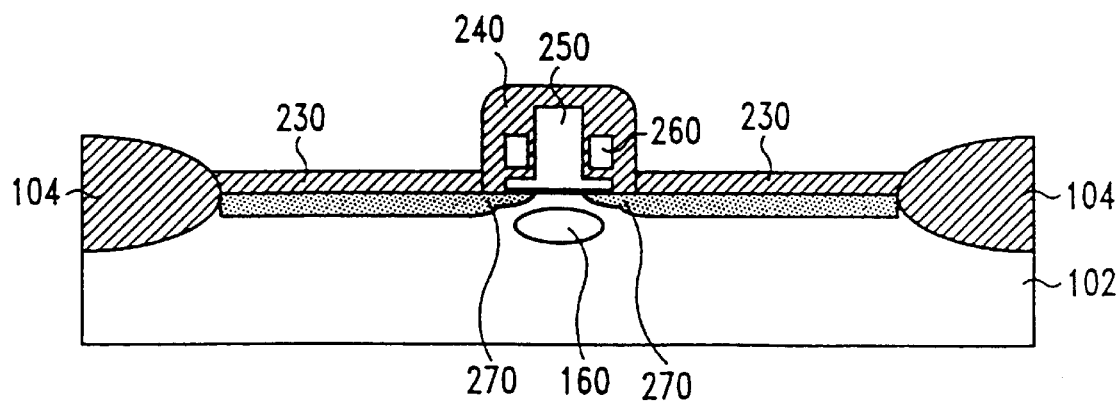
FIG. 13. is a cross-sectional view of an oxidation to seal the dual hollow so as to form dual air gap in the gate structure and formed S/D junction extended S/D junction in accordance with the present invention.

For completeness of fabricating a MOSFET with inverse T-shaped air gap structure, as shown in FIG. 13, a high temperature oxidation is done to recover the extended defects and damages, which occurred during the processes of the ion implantation and the dry etching steps. It is noted that defect reduction may be achieved by adequate high temperature annealing, but this procedure is not often applicable because of limits set by process or product specifications. Hence, as proposed by Hagmann et al., in the paper "D. Hagmann, D. Steiner, and T. Schellinger, J. Electrochem. Soc. 133, p. 2597 (1986), with title "Method to Impede the Formation of Crytal Defects after High Dose Arsenic Implants." the post-implantation growth of an oxide skin to reduce the formation of extended defects during subsequent high temperature treatments is preformed. The annealing condition reported by Hagmann, is that by 800° C./30 min dry oxygen for 30 min furnace treatment immediately after implantation. The annealing process is found to effectively impede the defect formation during high temperature furnace treatment for arsenic implanted samples. Hence, in a preferred embodiment, the oxidation annealing is done at a temperature of about 700°–1100° C. for 0.5–120 min. Since the doped impurities in the substrate can assist the oxidation rate, hence the top of poly-Si (or α-Si) 210 has faster oxide growth rates, and becomes dilated and seals the dual hollow. Therefore, two gate-side air-gaps structure 260 are observed to form. It is noted that all remnant α-Si will be transformed to poly-Si if there still contains some α-Si. The oxide layers 230, 240 are thermally grown from the front face of the substrate and the gate structure to about 20–100 nm and 20–100 nm in thickness, respectively, on the surface of the source/drain region 200 and the poly-Si 150, 180 gate region. Finally, an inverse T shape poly-Si 250 enclosed by the oxide 240 is observed. It is noted the thickness of the oxide layer 240 on an inverse T gate is much thicker than that on the S/D 200 substrate.

Still referring to FIG. 13, the impurities are found to diffuse both lateral and longitudinal into interior of the substrate 102 to form extended punchthrough stopping region 160, shallow S/D junction 200, and an extended S/D junction 270.

The benefits of this invention are that the device operation speed can be improved due to reduction of the parasitic resistance (e.g. an extended source/drain junction guarantee the lower resistance) and the parasitic capacitance (by inverse T-shaped air-gap gate structure). In addition another benefit include that the maximum lateral electric field E$_{max}$ can be reduced (by the inverse T gate structure).

As is understood by a person skilled in the art, the foregoing preferred embodiment of the present invention is an illustration of the present invention rather than limiting thereon. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

What is claim is:

1. A method for fabricating a MOS transistor with an inverse T-shaped air-gap gate structure on a semiconductor substrate which has a plurality of isolation regions and a pad oxide layer on an active region of said semiconductor substrate, said method comprising the steps of:

forming a nitride layer on said pad oxide layer and said isolation regions;

removing a portion of said nitride layer and said pad oxide layer, thereby leaving a remaining portion of said pad oxide layer to define a gate hollow region;

forming a dielectric layer on said gate hollow;

forming a first silicon layer over all areas of said semiconductor substrate;

performing a first ion implantation into said semiconductor substrate so as to form a punchthrough stopping region in said semiconductor substrate, wherein said region is beneath said dielectric layer;

forming an oxide layer over all surfaces of said semiconductor substrate;

performing an anisotropic etching to etch said oxide layer to form oxide spacers on inner sidewalls of said gate hollow and leave a remaining portion of said gate hollow;

forming a second silicon layer over all areas of said semiconductor substrate to fill said remaining portion of said gate hollow;

removing said oxide spacers on sidewalls of said gate hollow so that a dual hollow is formed;

etching back said second and first silicon layer until said nitride layer is exposed and a flat surface is formed;

performing a second ion implantation so as to form LDD regions in the semiconductor substrate, wherein said regions are formed under a bottom portion of said dual hollow;

removing said nitride layer on said pad oxide layer of said semiconductor substrate;

removing said remaining portion of said pad oxide on said active region of said semiconductor substrate;

performing a third ion implantation to form doped source/drain/gate regions; and performing a thermal oxidation so as to form an oxide layer on all exposed surfaces and to form air gap structures in sidewalls of said gate structure as well as to form an extended source/drain junction.

2. The method of claim 1, wherein said nitride layer is deposited by LPCVD to a thickness of about 80–300 nm.

3. The method of claim 1, wherein said dielectric layer is a nitrogen-rich oxide with a thickness of about 2–20 nm, and said nitrogen rich oxide is formed in an ambient selected from a group consisting of $N_2O/NO$, $O_2$:$N_2$=1:99 and $O_2$:$N_2$=2:98.

4. The method of claim 1, wherein said first silicon layer is an amorphous silicon and is formed at a temperature of about 350°–560° C. to about 10–50 nm by a method selected from a group consisting of PECVD and LPCVD.

5. The method of claim 1, wherein said first ion implantation is implanted by using p-type ions for NMOS transistor with an energy and a dosage of about 30–150 keV and of about $5\times10^{11}$ to $5\times10^{13}$/cm$^2$, respectively.

6. The method of claim 1 wherein said first ion implantation is implanted by using n-type ions for PMOS transistor with an energy and a dosage of about 30–150 keV and of about $5\times10^{11}$ to $5\times10^{13}/cm^2$, respectively.

7. The method of claim 1, wherein said oxide layer is deposited to a thickness of about 20–100 nm by a method selected from a group consisting of LPCVD, ECRCVD and PECVD.

8. The method of claim 1, wherein said second silicon layer is amorphous silicon formed by a PECVD method at a temperature of about 250°–400° C.

9. The method of claim 1, wherein said second silicon layer is an amorphous silicon layer formed by a LPCVD method at a temperature of about 400°–550° C.

10. The method of claim 1, wherein said flat surface is achieved by chemical/mechanical polishing.

11. The method of claim 1, wherein said flat surface is achieved by a dry etching method.

12. The method of claim 1, wherein said second ion implantation is implanted by using n-type ions with an energy and a dosage of about 10–80 keV and of about $5\times10^{12}$ to $2\times10^{14}/cm^2$, respectively.

13. The method of claim 1, wherein said second ion implantation is implanted by using p-type ions with an energy and a dosage of about 10–80 keV and of about $5\times10^{12}$ to $2\times10^{14}/cm^2$, respectively.

14. The method of claim 1, wherein said third ion implantation is implanted by using n-type ions with an energy and a dosage of about 0.5–60 keV and of about $10^{14}$ to $2\times10^{16}/cm^2$, respectively.

15. The method of claim 1, wherein said third ion implantation is implanted by using p-type ions with an energy and a dosage of about 0.5–60 keV and of about $10^{14}$ to $2\times10^{16}/cm^2$, respectively.

16. The method of claim 1, wherein said thermal oxidation is performed at a temperature of about 700°–1100° C. for 0.5–120 min to form said oxide layer of about 20–100 nm and 20–100 nm in thickness on said source/drain region and on said gate structure region, respectively.

* * * * *